US 6,597,618 B2

(12) United States Patent
Zheng et al.

(10) Patent No.: US 6,597,618 B2
(45) Date of Patent: Jul. 22, 2003

(54) MAGNETIC TUNNEL JUNCTION MAGNETIC RANDOM ACCESS MEMORY

(75) Inventors: Yuankai Zheng, Singapore (SG); Yihong Wu, Singapore (SG); Xiaoyan Wang, Lund (SE); Dan You, Singapore (SG)

(73) Assignee: Data Storage Institute, Singapore (SG)

( * ) Notice: Subject to any disclaimer, the term of this patent is extended or adjusted under 35 U.S.C. 154(b) by 0 days.

(21) Appl. No.: 10/185,667

(22) Filed: Jun. 27, 2002

(65) Prior Publication Data

US 2003/0103404 A1 Jun. 5, 2003

(30) Foreign Application Priority Data

Dec. 4, 2001 (SG) .......................... 200107550

(51) Int. Cl.[7] ................................. G11C 7/00
(52) U.S. Cl. ..................... 365/225.5; 365/158
(58) Field of Search ................ 365/225.5, 158, 365/171, 173, 189.01, 207

(56) References Cited

U.S. PATENT DOCUMENTS

| 5,640,343 A | * | 6/1997 | Gallagher et al. | ........... 365/171 |
| 6,259,644 B1 | | 7/2001 | Tran et al. | .................. 365/209 |
| 6,304,477 B1 | * | 10/2001 | Naji | ............................ 365/158 |
| 6,317,375 B1 | | 11/2001 | Perner | ........................ 365/206 |
| 6,341,084 B2 | | 1/2002 | Numata et al. | ............. 365/158 |
| 6,418,046 B1 | * | 7/2002 | Naji | ............................ 365/158 |

FOREIGN PATENT DOCUMENTS

JP 2001325791 11/2001

OTHER PUBLICATIONS

Boeve, H. et al., IEEE Transactions on Magnetics, vol. 35(5), 2820–2825 (Sep., 1999).

* cited by examiner

Primary Examiner—Michael S. Lebentritt
Assistant Examiner—Anh Phung
(74) Attorney, Agent, or Firm—McDermott, Will & Emery

(57) ABSTRACT

A circuit for controlling a read operation for a magnetic random access memory (MRAM) comprising an array of magnetic tunnel junctions (MTJ) having conducting row and column lines attached thereto. The circuitry comprises a current supply for providing a read current, and a row selector for selecting a row containing a junction to be read and applying the read current to that row with the respective row line. An unselected row switch switches to at least some of the row lines not connected to the MTJ to be read, and a voltage source applies, via the unselected row switch, a voltage to each of the unselected row lines that is substantially identical in level to the voltage on the selected row line. A column selector selects the column line connected to the array containing the MTJ to be read, and a voltage detector for detecting the voltage across the MTJ to be read via the selected column and row lines.

9 Claims, 6 Drawing Sheets

MAGNETIC TUNNEL JUNCTION MAGNETIC RANDOM ACCESS MEMORY

BACKGROUND OF THE INVENTION

The present invention relates to circuitry for controlling Magnetic Tunnel Junction (MTJ) devices for Magnetic Random Access Memory (MRAM) devices.

MTJ devices for providing an MRAM are becoming popular and are considered to be of merit because they provide high data read speeds and enable provision of a memory device which is non-volatile.

A typical structure of an MTJ includes a substrate onto which is formed a bottom lead. A seed layer is formed on the bottom lead and then an antiferromagnetic (AFM) layer formed on the seed layer. Above this is formed a pinned ferromagnetic layer, followed by an insulator layer and a free ferromagnetic layer. The free ferromagnetic layer is then capped and a top lead layer formed thereon. In simple terms, when the magnetisation of the free layer is parallel to that of the pinned layer the resistance of the device is low. However, when free layer magnetisation is anti-parallel to that of the pinned layer the resistance of the device is high.

Usually, the magnetisation of the pinned layer is fixed by the AFM layer. The magnetisation of the free layer can be changed from parallel to anti-parallel to that of the pinned layer by application of an external field. Using the properties of the device the magnetisation of the free layer can be used to record data. The different magnetisation states represent different resistance for the cell and the resistance can represent a "0" or a "1" and act as a memory. Of course, in practice it is desirable to produce an array of MTJ devices, and this is usually done with individual devices in the array being connected in parallel. In such a case each of the devices in a cell connected at the cross junctions of the column and row lines of the array of cells. Mutual electrical connections are provided between all of the MTJ cells. However, this provides a shunting arrangement which has disadvantages. For example, the shunting arrangement adversely affects signal to noise ratio in a read operation, and has a further disadvantage in that in such a configuration the individual resistance and magneto resistance of a particular device in the array can not be detected separately and directly.

PRIOR ART

Improvements of the above arrangement have been suggested, and these include a provision of a diode or switching transistor for each device in the array. Discussion of this technology can be found, for example, in U.S. Pat. No. 5640343 or in IEE Transactions, Magnetics 35(5), 2820(1999), Hans Boeve, et al. Provision of these extra components increases the overall cost of the memory array, however, and makes it difficult to produce a small device.

A further problem associated with such arrays is that, as storage density increases, cell dimension and lead wire width decrease, which results in an increase in connector resistance and decrease in relative cell resistance, causing problems in terms of increased signal to noise ratio.

The present invention seeks to provide a circuit for controlling MTJ devices for use in a magnetic random access memory, together with a MRAM which is free of the shunting effect found in prior art devices. It also seeks to overcome the problems associated with prior art devices in relation to connection lead resistance.

SUMMARY OF THE INVENTION

According to the present invention there is provided a circuit for controlling a read operation for a magnetic random access memory (MRAM) comprising an array of magnetic tunnel junctions (MTJ) having conducting row and column lines attached thereto, the circuitry comprising:

a current supply for providing a read current;

a row selector for selecting a row containing a junction to be read and applying the read current to that row with the respective row line;

an unselected row switch for switching to at least some of the row lines not connected to the MTJ to be read;

a voltage source for applying, via the unselected row switch, a voltage to each of the unselected row lines that is substantially identical to the voltage on the selected row line;

a column selector for selecting the column line connected to the array containing the MTJ to be read; and a voltage detector for detecting the voltage across the MTJ to be read via the selected column and row lines.

The voltage source may comprise a voltage follower having an input attached to the read current source and having an output attached to the input of the unselected row switch, and the voltage follower may comprise an appropriately configured operational amplifier.

According to the present invention there is also provided a magnetic random access memory comprising an array of magnetic tunnel junctions, each MTJ connected across a grid of electrically transmissive column and row lines to define a series of rows and columns of MTJ's; and a circuit of the type defined above.

In an MRAM according to the present invention the read lines may define the row lines, with the write lines defining the column lines.

A corresponding method is also provided.

BRIEF DESCRIPTION OF THE DRAWINGS

An example of the present invention will now be described with reference to the accompany drawings in which.

DETAILED DESCRIPTION

Figure 1B:
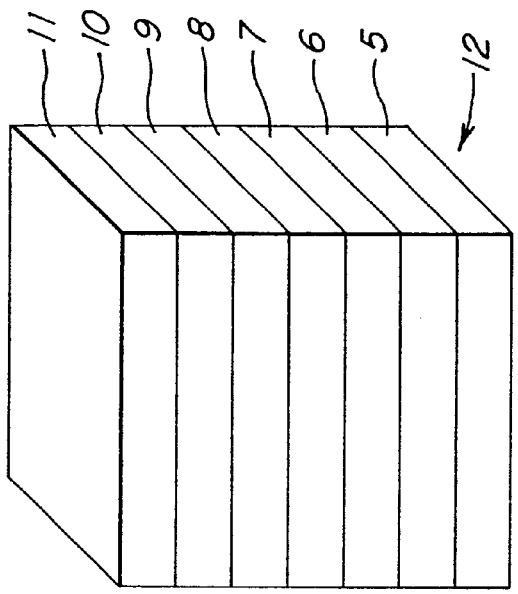
FIG. 1B is an enlarged view of one of the cells shown in the array of FIG. 1A.
Figure 1A:
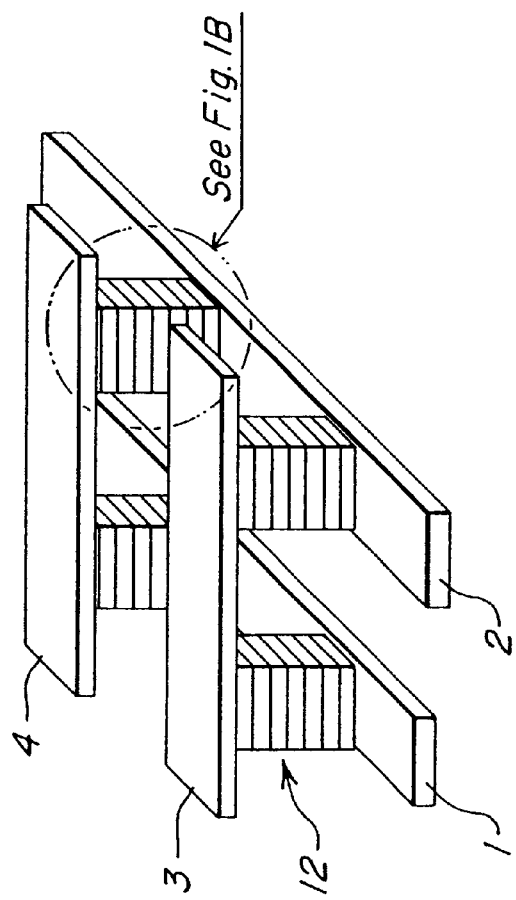
FIG. 1A is a schematic view of an array of magnetic memory cells employing an MTJ construction for use with circuitry according to the present invention.

Turning now to the drawings, FIG. 1A is a schematic illustration of an MTJ MRAM according to the invention with magnetic cells 12 located vertically between bit and word lines. The array includes a set of electrically conductive traces that function as parallel word lines 1 and 2 in a plane, and a set of electrically conductive traces that function as parallel bit lines 3 and 4 in a plane parallel to that of the word lines 1,2. The bit lines 3, 4 are oriented in a different direction, preferably at right angles to the word lines 1, 2, so that the two sets of lines intersect when viewed from above. A device according to the invention shown in detail in FIG. 1B. A device is located at each crossing point of the word lines 1, 2 and bit lines 3, 4 in the intersection region spaced between lines to define an individual memory cell 12. Two word lines and two bit lines are illustrated in FIG. 1A, but the number of lines would typically be much larger. The memory cell 12 is arranged in a vertical stack and includes a magnetic tunnel junction (MTJ). During the read operation of the array, current flows through the cell 12. The current path through the memory cell 12 permits the memory cell 12 to occupy a very small surface area because contact to the word lines, the MTJ and the bit line all occupy the same area. A layer of insulator, not shown for simplicity is located between the bit lines 3, 4 and word lines 12 of the MRAM in regions other than the intersecting regions.

The structure of the memory cell 12 will now be described in more detail with reference to FIG. 1B. The memory cell 12 is formed on and in contact with a word line 1 (FIG. 1A). The memory cell 12 is formed of a series of layers of material stacked one on top of the other. The MTJ 9 in the preferred embodiment comprises the following layers: a template layer 5, formed from a material such as Ta, an initial ferromagnetic layer 6, such as a permalloy (NiFe), an antiferromagnetic layer 7 (AF), such as IrMn, a fixed ferromagnetic layer 8 (FMF), such as CoFe, a thin tunnelling barrier layer 9 such as $Al_2O_3$, a soft ferromagnetic layer 10 (FMS), such as a sandwich of thin CoFe with permalloy, and a contact layer 11, such as Pt. The FMS layer is fabricated to have a preferred axis for its direction of magnetization known as its easy axis. The other possible direction of magnetization of the cell is its unidirectional anisotropy direction, and this direction is parallel to the easy axis of the FMS layer. The desired easy axis for the FMS layer is set by a combination of one or more of intrinsic anisotropy, strain-induced anisotropy and shape anisotropy of the MTJ in a known manner. The MTJ and FMS is made, in this example in the shape of a rectangle of length L and width W, where L is larger than W (FIG. 1B). In this case the magnetic moment of FMS prefers to align along the direction of L.

The unidirectional anisotropy direction of the FMF layer 8 is set by growing the IrMn AF layer 7 on the initial ferromagnetic layer 6, which is itself grown on the template layer 5. The template layer 5 induces a 111 crystallographic texture in the initial ferromagnetic layer 6. These layers are deposited in a magnetic field directed parallel to the desired easy axis of FMS 10, creating the desired intrinsic unidirectional anisotropy direction of FMF 8. Alternatively, the AF layer 7 can be deposited on the template layer 5 in a sufficiently large magnetic field parallel to the said axis while heating the substrate to a temperature higher than the blocking temperature of the AF material. In this alternative, the initial ferromagnetic layer is not required. It is also possible to take advantage of the magnetostriction of the FMF layer to develop, during processing, a magnetic anisotropy which aligns magnetization along the applied magnetic field direction during deposition.

Figure 2:
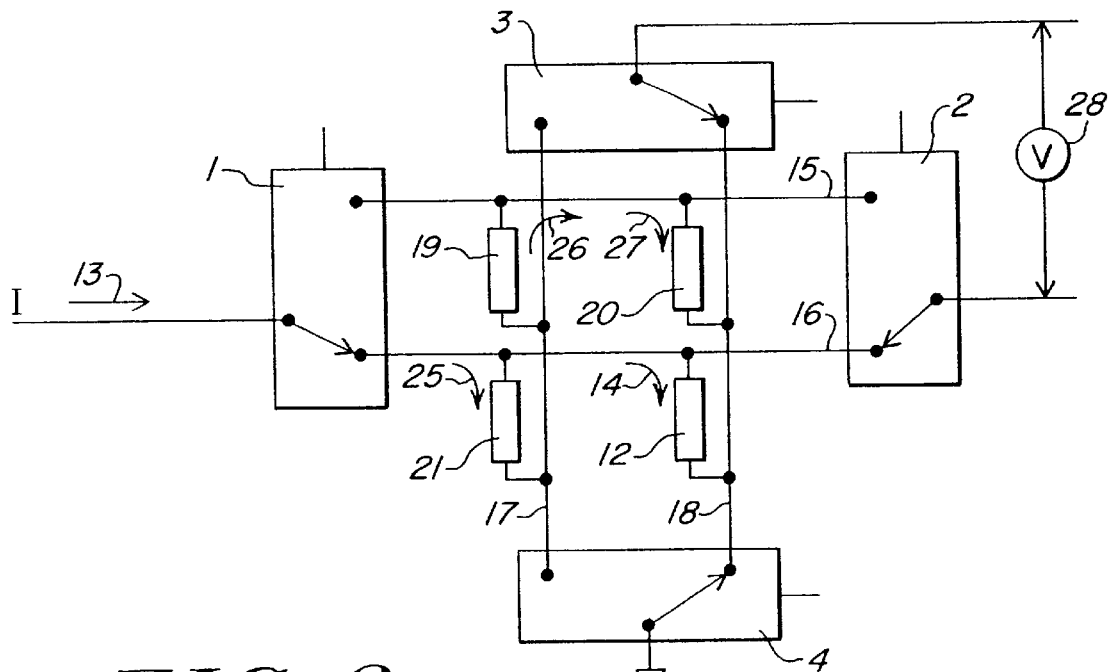
FIG. 2 is a schematic circuit diagram showing known control circuitry associated with a known MTJ.

FIG. 2 is a view of a schematic of a conventional four-point probe MTJ MRAM read operation structure without switch transistor and diode. 15, 16 are the bit lines. 17, 18 are the word lines. A cell can be selected through the bit line select IC, 1, 2 and the word line select IC 3, 4. A conventional read operation for cell 12 is as follows: bit line 16 is selected and the word line 18 is selected. Then a current 13 is applied between the bit line 16 and the word line 18. Finally, the voltage will be detected by a voltmeter 28. In this detect method, the current 13 not only flows into cell 12 indicated by current 14, but also flow into cells 11, 9, 10, indicated by currents 25, 26, 27 respectively. This effect is known as the shunting effect. The shunting effect cause a reduction of the signal to noise ration (SNR). As the memory array size increases, the SNR decreases more severely.

Figure 3:
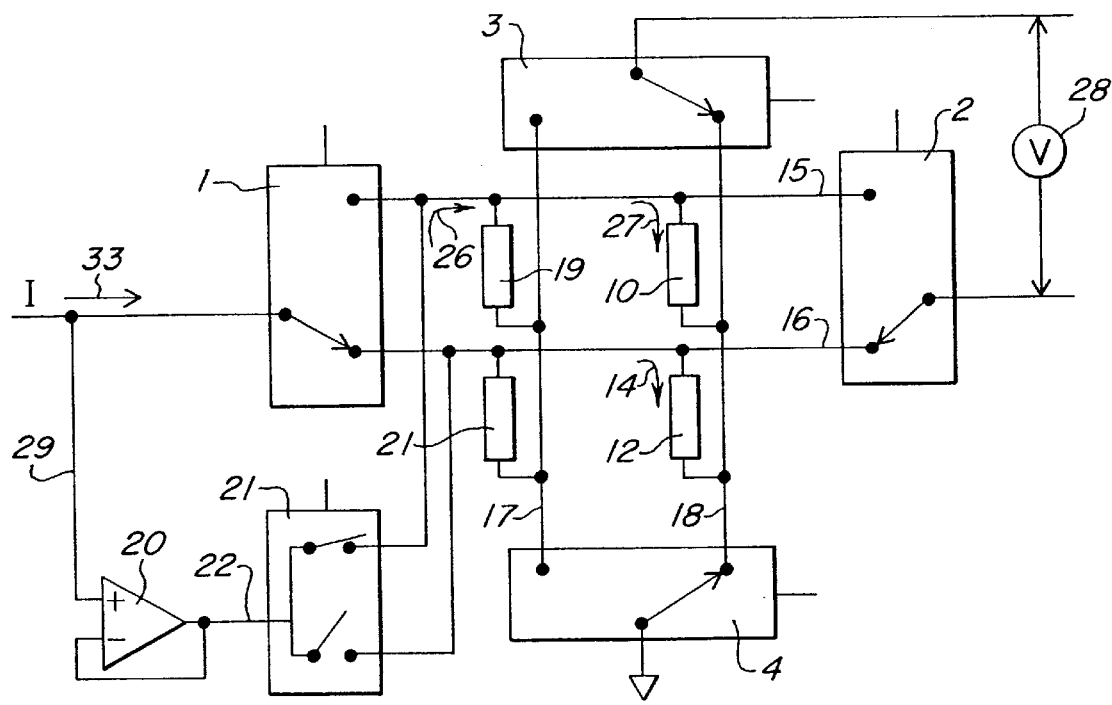
FIG. 3 is a circuit diagram showing operation of a circuit according to the present invention during a read operation.

FIG. 3 is a view of a schematic of a present invention switch-free MTJ MRAM read operation structure. Again, 15, 16 are the bit lines, and 17, 18 are the word lines. A cell can be selected through the bit line select IC 1, 2 and the word line select IC 3, 4. Additional IC 21 is on anti-bit line selector, which can select the other unselected bit lines. IC 20 is an operational amplifier, which serves as a voltage follower, and it can apply a voltage to the unselected bit lines.

The detailed operation with cell 12 is as follows: bit line 16 is selected through 1, 2; word line 18 is selected through 3, 4; and the unselected bit line is connected to the output 22 of the voltage follower 20. Then a current 13 is applied between the bit line 16 and the word line 18. Finally, the voltage is detected by the voltmeter 28. In this detect method, the output voltage 22 of IC 20 is equal to the input voltage 29. So the voltage of the bit line 15 is equated to that of the bit line 16. There is almost no current flow into the cells 19, 21 and the word line 17. Current 13 only flows into cell 12 indicated by current 30. The voltage detected by the voltmeter 14 is equal to the products of current 13 and the resistance of cell 12. Therefore the shunting effect has been suppressed effectively and the SNR can be retained at its original level. As the cell 10 is also selected by the IC 21, there is current flow 27 into the cell 10, which causes a increment in read power dissipation. However, as the sense current is very small and the block size is not very large, the read power dissipation increment can be controlled to a reasonable level.

Figure 4:
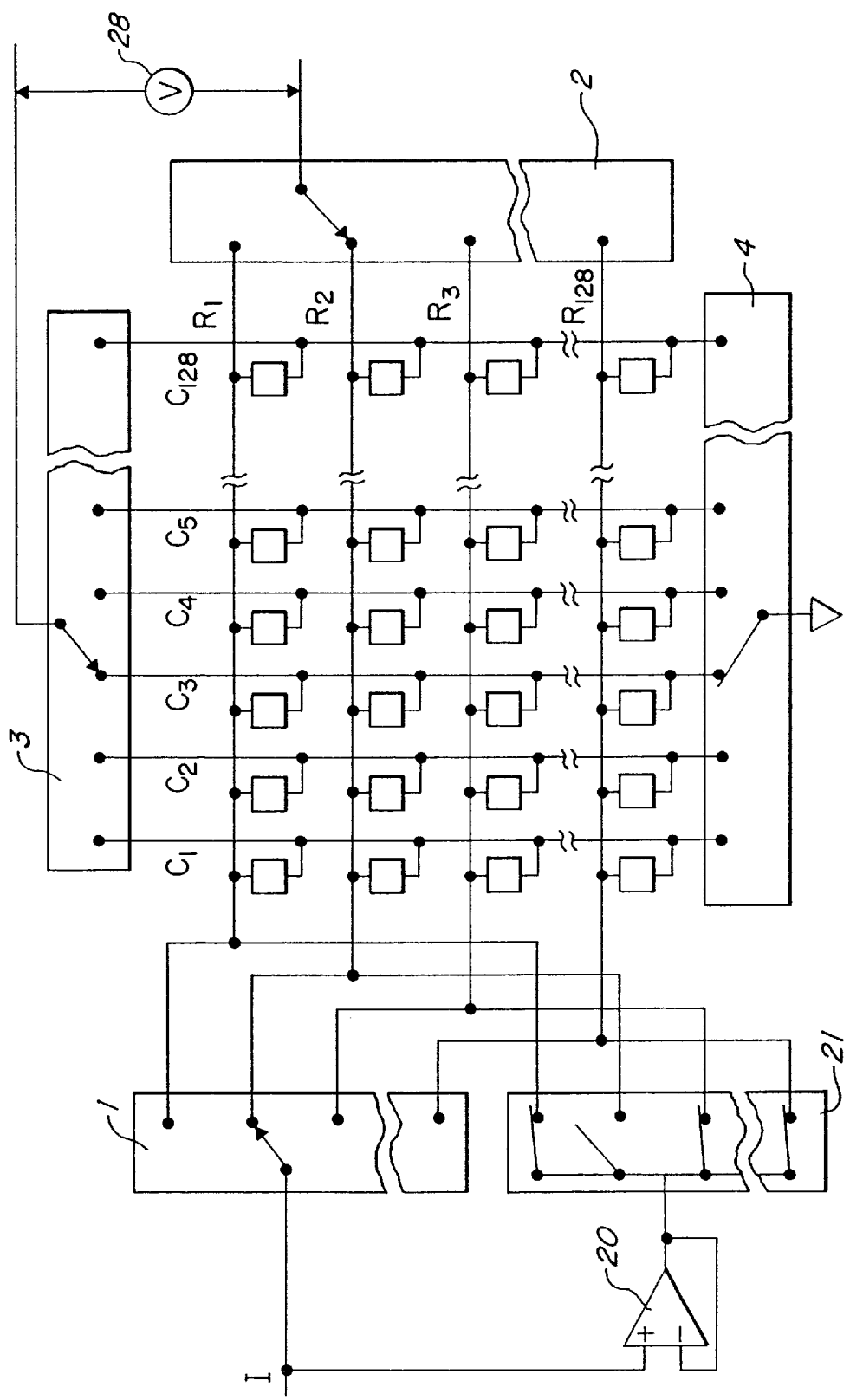
FIG. 4 is a schematic circuit diagram showing an array of MTJ cells and control circuitry according to the invention during a read operation for an array with 128×128 cells.

FIG. 4 shows a detailed schematic of a switch-free MTJ MRAM read operations for a block with 128×128 cells. As in the previous embodiments, the row directions R1, R2, R3 . . . R128 are in respect of bit lines, and the column directions C1, C2, C3 . . . C128 are in respect of word lines. A cell 12 can be selected through the bit line select IC 1, 2 and the word line select IC 3, 4. Additional IC 21 is on anti-bit line selector, which can select the other unselected bit lines. IC 20 is an operational amplifier, which serves as a voltage follower, and it can apply a voltage to the unselected bit lines. One can see that only one voltage follower 20 is required for one block. Furthermore, the voltage follower 20 can be used for the other blocks in a MRAM chip also.

Figure 5A:
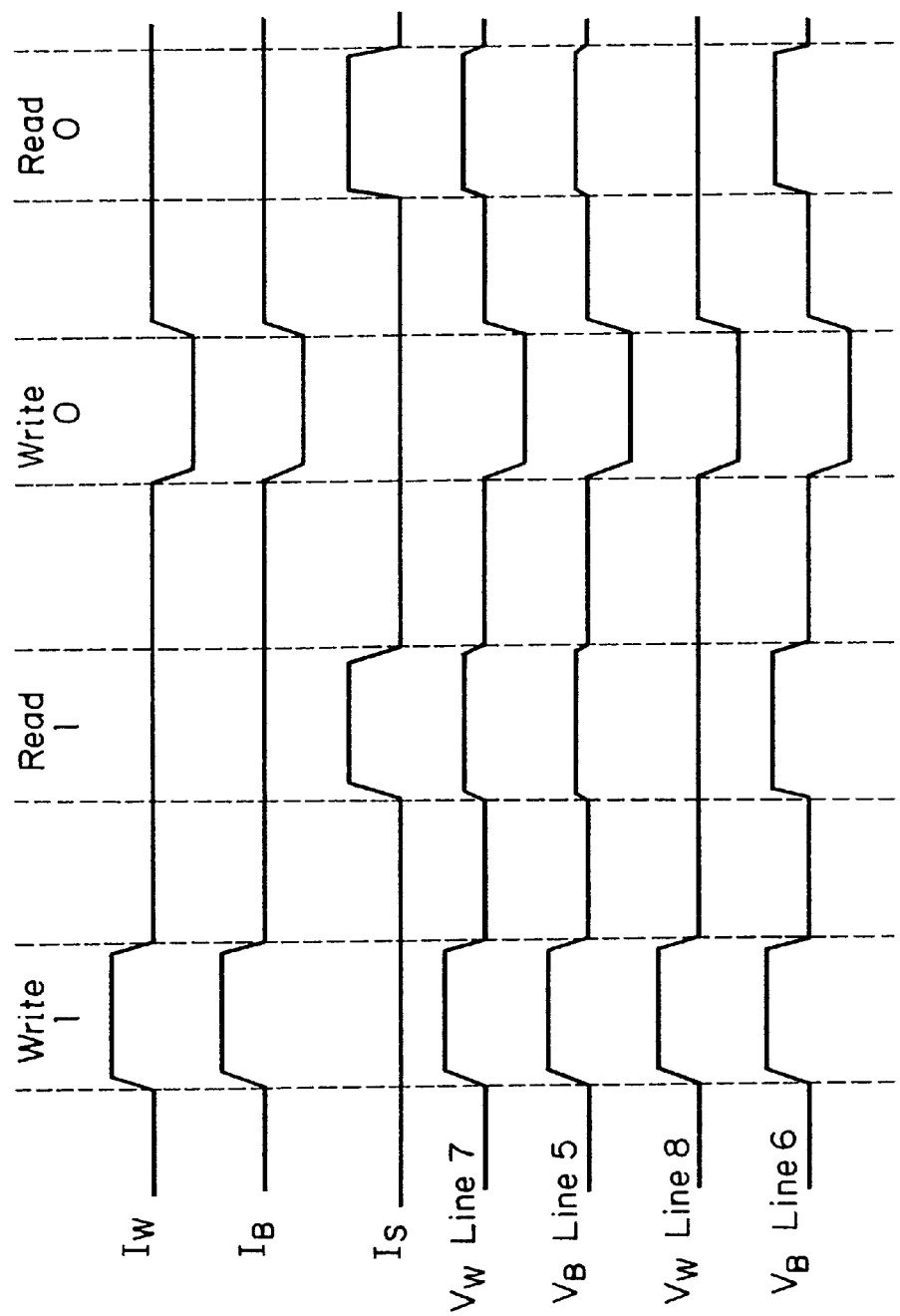
FIG. 5A is a timing diagram showing the voltage and current levels on a known MTJ memory device switching with the circuit of FIG. 2.
Figure 5B:
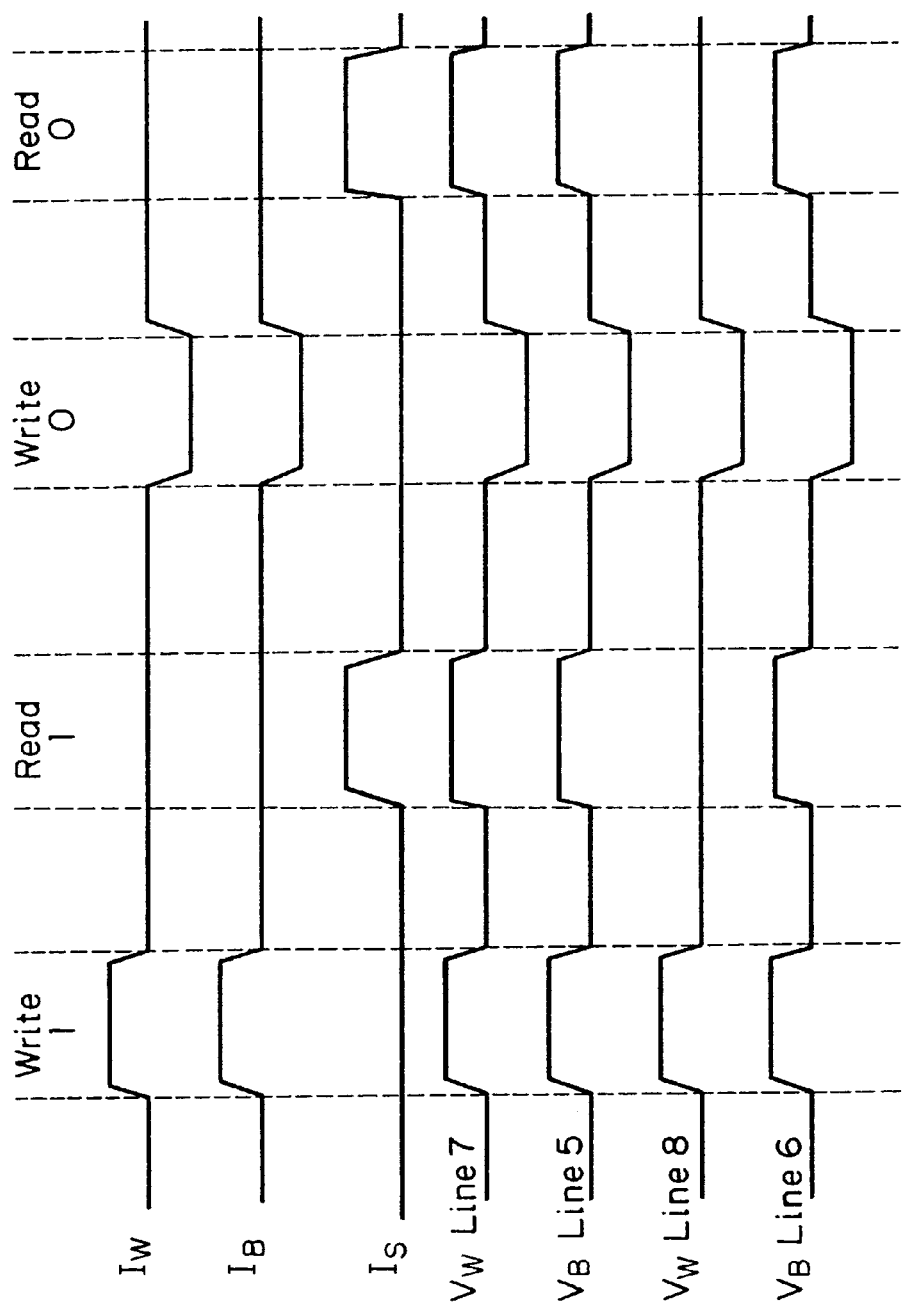
FIG. 5B is a timing diagram showing the voltage and current levels during a read and write operation of a device of the present invention switching with the circuit of FIG. 3.

FIG. 5A is a view of the voltage and current levels on the bit and word lines during MTJ MRAM read and write operation for a conventional four-point probe method. FIG. 5B is a view of the voltage and current levels on the bit and word lines during MTJ MRAM read and write operation for the present invention. During the read operation, $V_B$ of bit line 15 is not equal to $V_W$ of word line 17 and $V_B$ of bit line 16 for the conventional four-point probe method, so there is current flow into cells 21, 19 and 20. On the other hand, $V_B$ of a bit line 15 is equal to $V_B$ of bit line 16 in the present method, so there is no current flow into cells 11 and 9. The shunting effect has been suppressed effectively in the present device and method.

Figure 6:
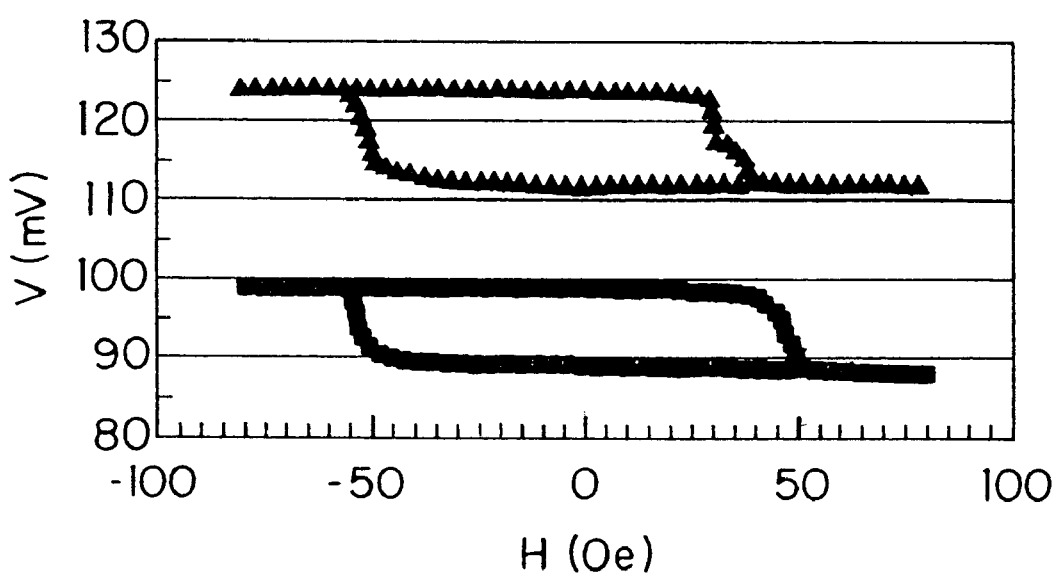
FIG. 6 is a graph showing magneoresistance as a function of external field measured by a), a known method, and b), a present method employing the circuitry of the present invention.

FIG. 6 is a graph which illustrates magnetoresistance as a function of the external field measure by (a) the conventional four-point probe method, and (b) present invention. Because of the shunting effect, there is only part of current flow into cell 12 with the prior art. It can also be seen that the detected voltage in the conventional four-point probe method is lower than that in the present invention, in which the total current flows into cell 12.

What is claimed is:

1. A circuit for controlling a read operation for a magnetic random access memory (MRAM) comprising an array of magnetic tunnel junctions (MTJ) having conducting row and column lines attached thereto, the circuitry comprising:

a current supply for providing a read current;

a row selector for selecting a row containing a junction to be read and applying the read current to that row with the respective row line;

an unselected row switch for switching to at least some of the row lines not connected to the MTJ to be read;

a voltage source for applying, via the unselected row switch, a voltage to each of the unselected row lines that is of a load substantially identical to the voltage load on the selected row line;

a column selector for selecting the column line connected to the array containing the MTJ to be read; and a voltage detector for detecting the voltage across the MTJ to be read via the selected column and row lines.

2. A circuit according to claim 1, wherein the voltage source comprises a voltage follower having an input attached to the read current source and having an output attached to the input of the unselected row switch.

3. A circuit according to claim 2, where the voltage follower comprises an appropriately configured operational amplifier.

4. A magnetic random access memory (MRAM) comprising an array of magnetic tunnel junctions, each MTJ connected across a grid of electrically transmissive column and row lines to define a series of rows and columns of MTJ's; and a circuit a current supply for providing a read current;

a row selector for selecting a row containing a junction to be read and applying the read current to that row with the respective row line;

an unselected row switch for switching to at least some of the row lines not connected to the MTJ to be read;

a voltage source for applying, via the unselected row switch, a voltage to each of the unselected row lines that is of a load substantially identical to the voltage load on the selected row line;

a column selector for selecting the column line connected to the array containing the MTJ to be read; and a voltage detector for detecting the voltage across the MTJ to be read via the selected column and row lines.

5. An MRAM according to claim 4, wherein the voltage source comprises a voltage follower having an input attached to the read current source and having an output attached to the input of the unselected row switch.

6. An MRAM according to claim 5, where the voltage follower comprises an appropriately configured operational amplifier.

7. An MRAM according to claim 4, in which the bit lines define the row lines, with the word lines defining the column lines.

8.t A method for controlling a read operation for a magnetic random access memory (MRAM) comprising an array of magnetic tunnel junctions (MTJ) having conducting row and column lines attached thereto, the method comprising the steps of:

selecting for selecting a row containing a junction to be read and applying a read current to that row via the respective row line;

applying, via an unselected row switch, a voltage to at least some of the unselected row lines that is substantially identical in level to the voltage on the selected row line;

selecting the column line connected to the array containing the MTJ to be read; and detecting the voltage across the MTJ to be read via the selected column and row lines.

9. A method according to claim 8, wherein the voltage is generated by a voltage follower having an input attached to the read current source and having an output attached to the input of the unselected row switch.

* * * * *